(12) United States Patent
Ahearn et al.

(10) Patent No.: US 9,324,899 B2
(45) Date of Patent: Apr. 26, 2016

(54) EMITTER DIFFUSION CONDITIONS FOR BLACK SILICON

(71) Applicants: Wendy G. Ahearn, Rochester, NY (US); David Howard Levy, Rochester, NY (US); Richard W. Topel, Jr., Rochester, NY (US); Theodore Zubil, Honeoye Falls, NY (US)

(72) Inventors: Wendy G. Ahearn, Rochester, NY (US); David Howard Levy, Rochester, NY (US); Richard W. Topel, Jr., Rochester, NY (US); Theodore Zubil, Honeoye Falls, NY (US)

(73) Assignee: Natcore Technology, Inc., Rochester, NY (US)

( * ) Notice: Subject to any disclaimer, the term of this patent is extended or adjusted under 35 U.S.C. 154(b) by 0 days.

(21) Appl. No.: 14/734,256

(22) Filed: Jun. 9, 2015

(65) Prior Publication Data
US 2015/0357506 A1    Dec. 10, 2015

Related U.S. Application Data

(60) Provisional application No. 62/009,567, filed on Jun. 9, 2014.

(51) Int. Cl.
*H01L 21/00*    (2006.01)
*H01L 31/18*    (2006.01)

(52) U.S. Cl.
CPC ................. *H01L 31/1804* (2013.01)

(58) Field of Classification Search
CPC .................................................. H01L 31/186
USPC ............. 438/57, 71, 444–449, 665, 725, 942, 438/948–949
See application file for complete search history.

(56) References Cited

U.S. PATENT DOCUMENTS

| | | | |
|---|---|---|---|
| 7,339,110 B1 | 3/2008 | Mulligan et al. | |
| 8,075,792 B1 | 12/2011 | Branz et al. | |
| 8,143,143 B2 | 3/2012 | Buchine et al. | |
| 8,507,797 B2 | 8/2013 | Veerasamy | |
| 2008/0200036 A1* | 8/2008 | Stockum ................. | C03C 15/00 438/756 |
| 2010/0068890 A1 | 3/2010 | Stockum et al. | |
| 2011/0303265 A1* | 12/2011 | Yuan ................. | H01L 31/02327 136/252 |
| 2012/0034954 A1* | 2/2012 | Tabe ....................... | H04M 1/00 455/566 |
| 2012/0167966 A1 | 7/2012 | Hu et al. | |
| 2014/0322858 A1* | 10/2014 | Levy ................. | H01L 31/02363 438/71 |

OTHER PUBLICATIONS

Z. Huang et al., "Metal-Assisted Chemical Etching of Silicon: A Review", Advanced Materials vol. 23, p. 285 (2011).

* cited by examiner

*Primary Examiner* — Jami M Valentine
(74) *Attorney, Agent, or Firm* — Winstead PC

(57) ABSTRACT

In some cases, it is desirable to perform doping when manufacturing a solar cell to improve efficiency. Dopant diffusion may include the steps of: (a) an initial temperature ramp, (b) dopant vapor flow, (c) drive-in, and (d) cool down. However, doping may result in excessive doping, such as in regions where the solar cell has been nanoscale textured to provide black silicon, thereby creating a dead zone with excessive recombination of charge carriers. In the systems and method discussed herein, dopant vapor flow and drive-in steps may be performed at two different temperature set points to minimize or eliminate the formation of dead zones. In some embodiments, the dopant vapor flow may be performed at a lower temperature set point than the drive-in.

16 Claims, 4 Drawing Sheets

EMITTER DIFFUSION CONDITIONS FOR BLACK SILICON

RELATED APPLICATIONS

This application claims the benefit of U.S. Provisional Patent Application No. 62/009,567, filed on Jun. 9, 2014, which is incorporated herein by reference.

FIELD OF THE INVENTION

This invention relates to a process for performing emitter diffusion on a solar cell containing a black silicon antireflective layer. More particularly, to the use of different temperatures for doping and drive in.

BACKGROUND OF INVENTION

In recent years, there has been a renewed interest in renewable energy including solar energy, and this has resulted in extensive research into methods of fabricating higher efficiency solar cells that convert sun light into electricity by the photovoltaic effect. Research continues to design silicon-based solar cells that can achieve higher conversion efficiencies without an exorbitant increase in production costs.

The performance of solar cells and other optoelectronic devices is directly related to optical losses caused by high reflectivity. Flat silicon surfaces such as those found on an untreated silicon wafer have a high natural reflectivity across the entire range of the solar spectrum that could otherwise be converted to electrical energy by the silicon photovoltaic device. To produce high efficiency solar cells, researchers have sought ways to minimize reflection losses. One common approach has been to provide anti-reflection coatings (ARC) that typically are selected based on interference. For example, quarter wavelength transparent layers of materials such as $SiO_x$, $TiO_x$, ZnO, ITO, or $Si_3N_4$ are used as ARCs on silicon surfaces. All such ARC coatings are resonant structures and perform well only in a limited spectral range and for specific angles of incidence while the solar spectrum spans a wide range of wavelengths and the incident angle varies during the day. The typical results achieved with simple one-layer ARCs have been a reduction of the surface reflection to about 8 to 15 percent. With more difficult two-layer ARC coatings, the reflectivity can be reduced to about 4 percent, but this kind of coating is expensive to apply and is not effective when placed under glass in photovoltaic modules.

The efficient suppression of reflection in a broad spectral range can be achieved by deep surface texturing. In this regard, etching can be used on a smooth or polished silicon surface to produce rough surfaces with bumps and pits having typical sizes of several or even ten micrometers, and these rough surfaces exhibit reduced reflectivity due to its reflection and absorption characteristics. In one example, anisotropic etching of silicon in KOH/IPA mixtures produces densely packed pyramids that appear black. However, such etching has been typically limited to single crystalline silicon with <1,0,0,> surface orientation, and solar cell design is made more complex by the large penetration pyramids. This texturing also has reflectivity that increases rapidly with the angle of light incidence. More recently, it has been determined that a fine surface texturing on the nanometer scale may be utilized to control reflectivity of silicon surfaces. Specifically, a textured surface with features smaller than the wavelength of light is an effective medium for controlling reflectivity, and testing with regard to solar cell applications has shown that a fine texture that is only about 300 to 500 nanometers in depth and provides a gradual grading of the silicon density and of the index of refraction from the surface to the bulk that is adequate to suppress reflectivity of a silicon surface in the usable spectral range of photon energies above the band gap. Such a textured surface may be thought of a sub-wavelength structured surface that behaves itself as an anti-reflective surface, with the gradually tapered density of the anti-reflective surface suppressing reflection over a wide spectral bandwidth and over a large incidence angle of the incoming light. A method of nanoscale texturing of silicon surfaces has been developed that utilizes wet chemical etching to reduce optical losses due to surface reflection to below 5 percent at all solar wavelengths for crystalline silicon.

The above-described and other reported black silicon solar cells apparently have a zone of high photocarrier recombination throughout the density-graded surface. This high photocarrier recombination layer limits the open-circuit voltage by causing undesirable photocarrier recombination. The high recombination layer further reduces short-circuit current, especially by reducing the collection of photocarriers generated by the blue and green parts of the solar spectrum, e.g., 350 to 700 nanometer wavelength photons (sometimes referred to as "blue response" for the color of light that is in this part of the solar spectrum). Absorption of these blue and green photons occurs within the black silicon layer, and high recombination of created minority-type photocarriers prevents their collection through the circuit and reduces the current produced by the solar cell. This loss of blue response is one of the primary causes of the low efficiencies found in solar cells using black silicon anti-reflection in place of other anti-reflection coatings.

A significant cause of this undesirable high recombination of charge carriers is that the fine nanostructures, especially near the upper surface of the cell, have a tendency during the emitter diffusion to receive too much dopant incorporation. The high level of dopant incorporation leads to defects and thus the formation of so called "dead zone" areas. In these dead zone areas, charges generated recombine before having a chance to contribute significantly to the cell electrical output. Thus, there is a need for diffusion techniques that are both compatible with today's industrial emitter diffusion equipment, but also suited to the porous structures on black silicon surfaces.

SUMMARY OF THE INVENTION

In one embodiment, dopant diffusion includes the following steps: (a) an initial temperature ramp to raise the temperature of the wafer to diffusion temperatures; (b) a dopant vapor flow, in which the gas mixture flowing over the substrates includes the dopant source or dopant precursor, and optionally an oxygen and nitrogen gas background; (c) a drive-in comprising a further exposure to a background gas mixture of oxygen and nitrogen gas mixture, but without the presence of the dopant precursors; and (d) a step to cool down the wafer. The dopant vapor flow and drive-in steps may be performed at two different temperature set points. In some embodiments, the dopant vapor flow may be performed at a lower temperature set point than the drive-in. As a nonlimiting example, dopant vapor flow may be performed at temperatures equal to or between 770° C. to 830° C., or preferably equal to or between 780° C. to 820° C.; drive-in may be performed at temperatures equal to or between 830° C. to 900° C., or preferably equal to or between 840° C. to 880° C.; and/or the temperature difference between dopant vapor flow and drive-in may be greater than or equal to 30° C. or greater than or equal to 40° C.

The foregoing has outlined rather broadly various features of the present disclosure in order that the detailed description that follows may be better understood. Additional features and advantages of the disclosure will be described hereinafter.

BRIEF DESCRIPTION OF THE DRAWINGS

For a more complete understanding of the present disclosure, and the advantages thereof, reference is now made to the following descriptions to be taken in conjunction with the accompanying drawings describing specific embodiments of the disclosure, wherein.

DETAILED DESCRIPTION

Figure 1:
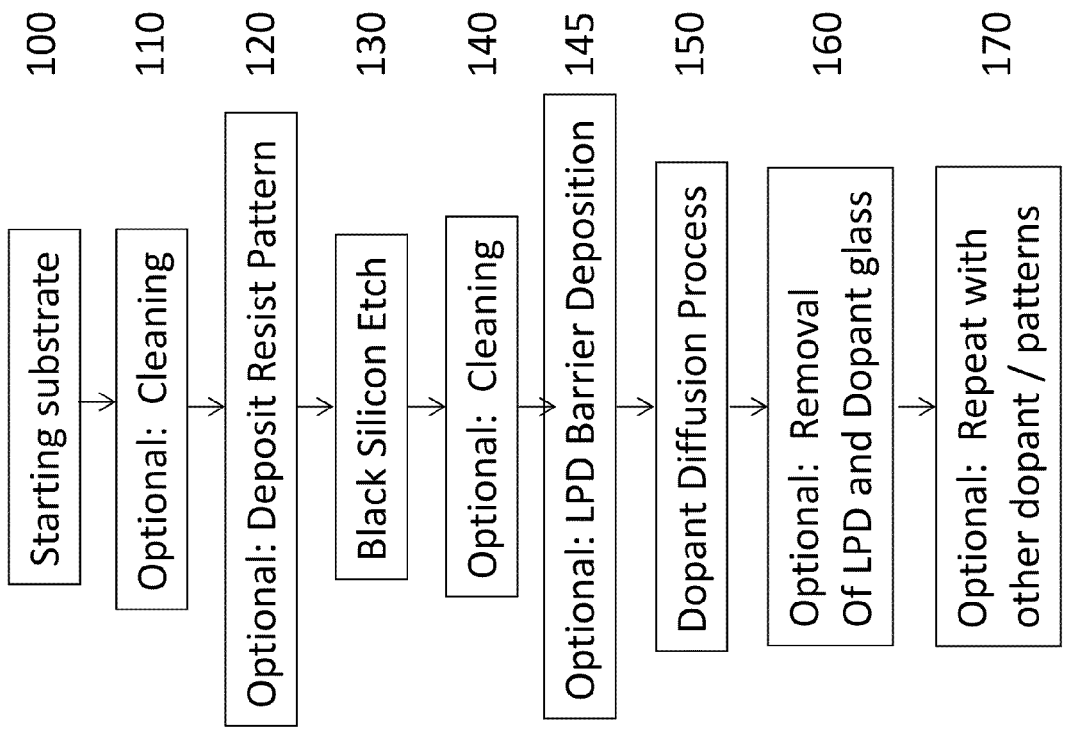
FIG. 1 is an illustrative embodiment of a flow chart for fabricating a solar cell.

Refer now to the drawings wherein depicted elements are not necessarily shown to scale and wherein like or similar elements are designated by the same reference numeral through the several views.

Referring to the drawings in general, it will be understood that the illustrations are for the purpose of describing particular implementations of the disclosure and are not intended to be limiting thereto. While most of the terms used herein will be recognizable to those of ordinary skill in the art, it should be understood that when not explicitly defined, terms should be interpreted as adopting a meaning presently accepted by those of ordinary skill in the art.

It is to be understood that both the foregoing general description and the following detailed description are exemplary and explanatory only, and are not restrictive of the invention, as claimed. In this application, the use of the singular includes the plural, the word "a" or "an" means "at least one", and the use of "or" means "and/or", unless specifically stated otherwise. Furthermore, the use of the term "including", as well as other forms, such as "includes" and "included", is not limiting. Also, terms such as "element" or "component" encompass both elements or components comprising one unit and elements or components that comprise more than one unit unless specifically stated otherwise.

A crystalline silicon photovoltaic (PV) cell has a front side surface operable to receive light and a back side surface opposite the front side surface. The front side surface is doped to form the emitter of the PV cell and has a plurality of electrical contacts formed therein. The back side surface has at least one electrical contact. Silicon solar cells may be nano scale textured to provide low reflectivity surfaces. Due to low reflectivity across a broad spectral range, silicon surfaces with a nanoscale texture are sometimes referred to as black silicon. For example, in some embodiments, the textured solar cells discussed herein may provide surfaces having diffuse reflectance that is equal to or below 5% in the range of 400 to 1100 nm wavelengths. In some embodiments, diffuse reflectance of textured solar cells discussed herein is equal to or below 3% in the range of 400 to 1100 nm wavelengths. This nomenclature is applicable even if the resulting surfaces are not perfectly black.

In addition, it may be desirable to provide a selective emitter in a silicon solar cell. A selective emitter may provide higher doped regions of the silicon surface or contact regions that are to be covered by a metal layer, whereas other regions are doped to a lower doping level to maintain anti-reflectivity. The higher doped regions provide a lower-loss contact to the underlying silicon, which reduces resistance related contact losses while allowing the other lower doped regions or anti-reflective regions to maintain high photocurrent generation.

Systems and methods discussed herein provide a diffusion process that is compatible with substrates having black silicon prior to doping to provide an emitter or emitter doping. In some embodiments, dopant diffusion includes the following steps: (a) an initial temperature ramp to raise the temperature of the wafer to diffusion temperatures; (b) a dopant vapor flow, in which the gas mixture flowing over the substrates includes the dopant source or dopant precursor, and optionally an oxygen and nitrogen gas background; (c) a drive-in comprising a further exposure to a background gas mixture of oxygen and nitrogen gas mixture, but without the presence of the dopant precursors; and (d) a step to cool down the wafer. However, doping may result in regions with high levels of dopant. In some cases, the doping may be so high (e.g. levels near and exceeding $10^{21}$ $cm^{-3}$) in some regions that charge carriers generated in such regions suffer from excessive recombination and do not contribute to the output of the cell, thereby reducing efficiency. Such regions are sometimes referred to as a dead zone or dead layer. As a nonlimiting example, dead zones may unwantedly result during doping in regions where black silicon texturing is present prior to doping. The systems and methods discussed herein provide an emitter doping process that avoids or reduces the risk of providing a dead zone during doping.

As an illustrative nonlimiting embodiment, a process for fabricating a solar cell is discussed herein. As the fabrication process details more than just an emitter doping process, it should be recognized by one of ordinary skill in the art that many of the fabrication steps are provided for illustrative purposes only and do not limit the claims except where explicitly stated.

FIG. 1 is an illustrative embodiment of a flow diagram for fabricating a post-nano emitter cell or a solar cell in which doping occurs after nanoscale texturing of the cell has been performed. A suitable substrate (step 100) is selected and introduced into the process. The suitable substrate may be a semiconductor wafer of any convenient size or shape. Non-limiting examples of suitable semiconductors includes group IV semiconductors such as silicon or germanium, group III-V semiconductors such as gallium arsenide or indium phosphide, and group II-VI semiconductors such as cadmium telluride. In some embodiments, the substrate thickness is preferably equal to or below about 1 mm. The surface of the semiconductor wafer may be polished. In some embodiments for solar cell applications, it may be preferable for the starting wafer to have a surface that is textured to promote light absorption. The surface texture may be applied by mechanical means, laser processes, chemical etching processes, or the like. In some embodiments for silicon wafers, the preferred surface texture may contain exposure of predominantly <111> and <110> facets, such as is obtained by treatment with basic solutions containing KOH or NaOH in conjunction with surfactants such as alcohols. In some embodiments, the surface may be chemically smoothed by treatment with various etchants. A starting wafer that has a rough texture resulting from the wafer sawing process can be chemically smoothed with hydroxide containing etchants, such as NaOH, KOH, TMAH (tetramethylammonium hydroxide), combinations thereof, or the like. The concentrations of these etchants can be greater than 10%, and etching may be performed at temperatures equal to or greater than 50° C. The resulting surface is substantially smoothed relative to the starting rough surface, but may still contain pits, depressions, or surface undulations.

The starting substrate may be highly pure and thus nearly intrinsic in doping character or may have a particular bulk doping leading it to be n-type or p-type. The presence of doping modifies the bulk resistivity of the substrate. In some embodiments, substrates have a bulk resistivity equal to or between about 0.1 to 50 ohm-cm. In some embodiments, substrates have a bulk resistivity equal to or between about 1 to 5 ohm-cm. In some embodiments, the substrate may have patterned doping regions. In some embodiments, the substrate may have various films on its surface such as dielectric or metal films. From the foregoing description, it is clear that the method is applicable to various substrates. Further, it will be recognized that a suitable substrate is in no way limited to the particular embodiments discussed.

The substrate is optionally cleaned (step 110). Cleaning of the substrate may be done by solution means, including, but not limited to, treatments with acids, bases, and oxidizing chemistries. Suitable cleaning solutions include the so called RCA process, involving exposure to at least (1) a solution including HCl and H2O$_2$; (2) a solution including NH$_4$OH and H$_2$O$_2$; and (3) a solution including HF. The exposure to cleaning solutions can include exposure to any combination of them in any suitable order. Cleaning can also include other solution exposures, such as the Piranha etch, comprising H$_2$SO$_4$ and H$_2$O$_2$, or solvent exposures, or cleaning in water. Useful solvents include alcohols, ketones, hydrocarbons, or halogenated solvents. Cleaning can also involve dry processes. These include ozone exposures, corona discharge treatments, plasma treatments, or the like. The treatments may be intended to clean the surface; however, it may be useful to combine cleaning with treatments that etch the surface.

In some embodiments, a resist pattern is optionally applied to the substrate (step 120) when patterning the nanoscale texturing is desired. The resist may be a polymeric material that can be formulated for easy printing, preventing the formation of nanoscale texturing, and optionally preventing the deposition of liquid phase deposition (LPD) films on its surface, and/or easy removal. The ease of removal requires that the polymer not degrade, crosslink, or harden during exposure to the chemistries of subsequent process steps. The polymer should not be soluble in water since it needs to survive water based processing steps, but for ease of processing and cleaning in manufacture it may be soluble in solvents that are themselves soluble in water. For example, polymers that work well for this method may require solubility in polar solvents (such as alcohols and alkyl acetates), but insolubility in water. Thus, the polymers can be applied by conventional printing methods, but do not dissolve during water based processing steps (such as the LPD deposition itself).

The resist material provides a barrier to etching that allows for patterned etching in one or more desired regions of a substrate. Additionally, in some embodiments, the resist material may also serve to completely or partially prevent the deposition of LPD material in the regions in which the resist is present. If the resist does not minimize the deposition of a LPD film, then the LPD film could form a barrier that prevents the resist from being easily removed. In the case of complete prevention of deposition, the process is a complete selective deposition. In the case of partial prevention of deposition, the process is partial selective deposition followed by liftoff where the portions of LPD film that forms on top of the resist are removed by dissolution of the resist. In some embodiments, complete selective deposition is desirable so that partial films of LPD that are lifted off do not contaminate the processing system.

Co-polymers comprised principally poly(vinylbutyral), poly(vinylacetate), and/or poly(vinylalcohol) may provide complete selective deposition and prevent the deposition of LPD films. In some embodiments, the polymers include equal to or greater than about 70% (molar basis) poly(vinylbutyral), equal to or between about 5% and 25% polyvinyl alcohol, with the remainder of poly(vinylacetate). In some embodiments, the polymers include equal to or greater than about 80% (molar basis) poly(vinylbutyral), equal to or between about 10% and 20% polyvinyl alcohol, with the remainder of poly(vinylacetate).

The resist may be printed by any conventional means, including inkjet printing or contact printing methods, such as flexographic printing. In some embodiments, the polymer may be printed using screen printing, as it is compatible with current solar cell processing. Ink formulations require the polymer to be in a solvent that has the correct evaporating and viscosity properties to make a suitable ink for printing. Appropriate solvents for the above polymers may include alcohols, including methanol, ethanol, isopropanol, large molecular weight alcohols, or the like. Appropriate solvents may also include ketones, including branched or straight chain compounds such as acetone or methyl isobutyl ketone, cyclic compounds such as cyclohexane, or the like. In some embodiments, the solvents include compounds that contain an ether or a ketone functionality in addition to an alcohol functionality. Nonlimiting examples of such materials may include butoxyethanol and diacetonealcohol. In some embodiments, the resist formulation may include fillers, surfactant, coating aids or drying aids.

After resist patterning, the substrate receives a nanoscale texture etch (step 130). The nanoscale texture etch can be any etching process that produces a suitable nanoscale structure with a pattern is defined by the resist pattern of step 120. In some embodiments, nanoscale structures comprise nanoscale pores that are equal to or between about 0.05 to 1 micron deep and have pore diameters equal to or below about 250 nm, preferably equal to or below about 100 nm to avoid light scattering. It should be understood that the pore diameters and depth discussed herein represent average values, rather than values of every pore produced. In some embodiments, nanoscale textures can be produced by dry processes, such as plasma etching and laser treatment. In other embodiments, nanoscale texture formation may utilize variants of metal assisted etching. For example, a suitable metal assisted etching process is described in "Metal-Assisted Chemical Etching of Silicon: A Review", Z. Huang et al., Advanced Materials Vol. 23, p. 285 (2011).

As a nonlimiting example, nanoscale etching processes may include the use of a metal catalyst which once deposited on the surface as a nanoparticle promotes localized etching. The metal catalyst can be deposited by vacuum means; for example, a nonlimiting example such as in a vacuum evaporated as described in U.S. Pat. No. 8,143,143. The metal catalyst can also be deposited by solution means. For example, water based solutions that contain a metal precursor and an acidic compound may be utilized. In some embodiments, HF may be utilized as the acid in the deposition of metal for the metal assisted etching, with the HF concentration between or equal to about 0.01 to 1 molar, preferably 0.05 to 0.5 molar. The metal used in the deposition may be any metal that promotes localized etching. Nonlimiting examples of metals that promote localized etching are silver, gold, copper, and platinum. Exemplary metal precursors may include silver nitrate or gold chloride. The concentration of the metal in the catalyst deposition solution can be equal to or between about 10 μM to 10 mM, preferably equal to or between about 0.2 mM to 5 mM. The temperature of the catalyst deposition treatment can be equal to or between about 10° C. to 50° C. The time of the catalyst deposition treatment can be equal to or between about 10 seconds to 5 minutes.

After deposition of the metal catalyst the nanoscale texturing is accomplished by exposing the substrate that any suitable liquid based etching formulation for which etching is enhanced in the vicinity of the metal catalyst nanoparticles. In some embodiments, etching treatment compositions include and acidic compound and an oxidizing compound. Nonlimiting examples of etching treatment compositions may include HF as the acidic component, with concentrations in the range equal to or between about 0.1 to 10 M, preferably 1 to 5 M. Etching treatment compositions may also include $H_2O_2$ as the oxidizing compound, with concentrations in the range equal to or between about 0.1 to 10 M, preferably 1 to 5 M. The temperature of the etching treatment can be equal to or between about 10° C. to 50° C. The time of the etching treatment can be equal to or between about 10 seconds to 5 minutes.

To facilitate manufacture, it may be desired to combine the above catalyst deposition treatment and etching treatments into a single solution, such as described in U.S. Pat. No. 8,075,792. A composition for a single solution nanoscale texturization may include a metal precursor, acidic compound, and an oxidizing compound. A nonlimiting example of a single solution nanoscale texturization may include silver nitrate at a concentration range between or equal to about 10 μM to 1000 μM, HF concentration range between or equal to about 0.1 to 10 M, and $H_2O_2$ concentration range between or equal to about 0.1 to 10 M. The temperature of the single solution nanoscale texturization during the etching step can be 10° C. to 50° C. The time of the single solution nanoscale texturization can be between or equal to about 10 seconds to 5 minutes.

The above nanoscale texturization processes may leave small amounts of metal catalyst on the substrate, as well as the resist. The resist and/or metal catalyst still present upon the substrate may optionally be removed prior to further cleaning or processing (step 140). Removal can be accomplished by any method that dissolves the metal catalyst. These metal removal processes include exposure to water based solution containing acids such as nitric acid, sulfuric acid, aqua regia, or water based solutions containing bases such as ammonium hydroxide or ammonium hydroxide in combination with oxidizing agents such as $H_2O_2$.

The polymer resist may also be removed as part of cleaning step 140. This removal may occur before or after the metal catalyst removal above. Alternatively, the polymer resist may remain and be used for additional patterning processes as described below. Removal of the resist can occur by rinsing, spraying, or immersion in an appropriate solvent. In some embodiments, the solvent is capable of solubilizing the resist material and is soluble in water to enable compatibility with subsequent processing steps and cleanup. Nonlimiting examples of solvents are alcohols, such as methanol, ethanol, isopropanol or the like. Smaller ketones, such as acetone, may also be utilized. In some embodiments, the removal of the resist may involve mechanical assistance such as sonication, sparging, mixing, or the like. Alternatively, the resist can be removed by dry processes, such as ozone treatment or plasma treatment. Suitable plasmas include an oxygen plasma in vacuum or in the form of an atmospheric air or oxygen plasma jet. In some embodiments, the resist may be removed by a burn off process that subjects the substrate to temperatures of 500° C. or greater. The burn off process may occur in the presence of oxygen and may occur for 1 minute or greater. This burn off process may be performed prior to, during ramp up to doping, or during a doping process.

After the nanoscale texturization but prior to removal of the polymer resist, it may be desirable to deposit additional layers that are also masked by the polymer resist pattern, and thus in automatic alignment with the nanoscale texture pattern.

An LPD deposition (step 145) can be optionally performed for the purpose of passivating the black silicon or providing a diffusion barrier to create a selective emitter structure after a dopant diffusion step. The LPD process provides a simple process for depositing a LPD material on the substrate. The LPD film forms a barrier or mask layer on the substrate that modulates dopant diffusion in subsequent process steps. The LPD film may also or alternatively serve to passivate the substrate. In some embodiments, the LPD film is patterned by the existing polymer resist pattern that was used to pattern the nanoscale texturization. This approach provides LPD barrier or passivation films only in regions over the nanoscale texture.

The LPD process relies upon manipulation of the chemical equilibrium of a solution containing precursors of a desired inorganic material. In some embodiments, the LPD process provides for the deposition of oxides such as but not limited to silicon dioxide, aluminum oxide, and titanium dioxide. According to one embodiment, silicon dioxide is at least partially dissolved in the solution; and preferably the solution further comprises $H_2SiF_6$ (fluorosilicic acid). Without wishing to be bound by any particular theory, it is believed that fluorosilicic acid can react with base to produce silicon dioxide, as shown in Equation (1).

$$H_2SiF_6 + 2\ OH^- \rightarrow SiO_2 + 2F^- + 4\ HF \quad (1)$$

The silicon dioxide LPD process requires as one reagent a saturated solution of silicon dioxide in $H_2SiF_6$. This solution is produced by combining a solution of between or equal to about 15 to 40% $H_2SiF_6$ by weight with an excess of silica in the form of a powder or concentrated slurry. The silica is dissolved to saturation at which point any excess silicon if filtered out. In some embodiments, the above saturated solution is combined with water in a ratio of between or equal to about 1 part saturated solution to between or equal to about 0.5 and 10 parts waters. In some embodiments, the above solution is combined with water in a ratio of between or equal to about 1 part saturated solution to between or equal to about 1.5 and 3 parts water. This mixture is maintained at a temperature between or equal to about 10° C. and 70° C., preferably between or equal to about 25° C. and 60° C. The substrates requiring deposition are placed within the mixture for times ranging from several minutes to several hours. Silicon dioxide grows spontaneously upon the immersed substrates, and the total growth can be controlled by modulating concentration, temperature, deposition time, or a combination thereof. Layer thickness for the LPD films will be discussed subsequently.

The substrate is subjected to a dopant diffusion process (step 150). In some embodiment, the dopant diffusion process involves elevating the temperature of the wafer and exposing it dopant precursor gases within an overall gas composition for a predetermined time. For production of an n-type doping region, a dopant atom may be phosphorous, which can be supplied by exposing the wafer to any suitable material containing phosphorous. This includes exposure to easily vaporizable phosphorous sources such as phosphine ($PH_3$) or phosphorous oxychloride (POCl$_3$). In some embodiments, the step may also involve applying a coating that contains phosphorous to the wafer prior to the high temperature step. Nonlimiting examples of coatings include so called spin on dopants, preferably dopants which contain P$_2$O$_5$ glasses in mixtures with silica and alumina based glasses. For production of a p-type doping region, a dopant atom may be boron, which can be supplied by exposing the wafer to any suitable material containing boron. This includes exposure to easily vaporizable boron sources such as boron tribromide (BBr$_3$). In some embodiments, the step may also involve applying a coating to the wafer prior to the high temperature step which contains boron. Nonlimiting examples of coatings include so called spin on dopants, preferably ones which contain borosilicate glasses in mixtures with silica and alumina based glasses. In these embodiments utilizing a dopant coating, use of the dopant coating in conjunction with dopant vapor flow may increase the dopant diffusion.

As discussed previously above, the vaporized dopant diffusion may comprise four steps: (a) an initial temperature ramp, (b) dopant vapor flow, (c) drive-in, and (d) cool down.

The initial temperature ramp comprises step(s) to raise the temperature of the substrate to diffusion temperatures. The initial temperature ramp may include one or more stages where the substrate is loaded into the diffusion device at a set temperature. During the one or more stages, an inert gas may be provided to the diffusion chamber holding the substrate. As a nonlimiting example, the initial temperature ramp may comprise three stages in which the temperature is increased slightly in each stage, and the diffusion chamber may receive N$_2$ and/or O$_2$ during these stages.

During the dopant vapor flow, a volatile dopant source, such as a phosphorous source POCl$_3$, is included in the vapor flow to the substrate or wafer, such as to a substrate in a tube. During the exposure of a silicon wafer at high temperature to the dopant and/or carrier gas, the dopant element may eventually react with the silicon surface and oxygen to produce a layer attached to the substrate containing the dopant. As a nonlimiting example, a substrate may be exposed to POCl$_3$, and optionally some oxygen, which results in a layer of phosphosilicate glass (PSG). This dopant source layer has a high concentration of the dopant and can serve during the high temperature dopant vapor flow and drive-in processes as a supply of the dopant material for doping the wafer. Referring back to the prior example, the PSG layer may provide phosphorus for doping.

Not wishing to be bound by theory, it is believed that the rate of growth of the dopant source layer (e.g. PSG) is dependent upon the temperature of the deposition and the concentration of the doping source (e.g. phosphorus or a phosphorous containing precursor) and oxygen. In particular, control of temperature during the dopant vapor flow can be used to very precisely control the amount of dopant source layer that is formed. Furthermore, in a porous structure, if the rate of dopant source layer deposition is not carefully controlled, the bulk of the dopant source layer deposition and formation may occur in the upper portions of the porous structure where reactants from the diffusion process first make contact with the silicon wafer. This would lead to excessive doping in the upper areas of the black silicon structure, where it is least desired.

In one embodiment, the doping process may involve at least two temperature set points, excluding temperature variations due to ramping, to prevent or minimize the formation of the unwanted dead zones. During the dopant vapor flow step, a dopant may be present in the gas phase in a diffusion system, and the doping vapor flow may be performed at a first temperature set point. In some embodiments, the first temperature may be in the range equal to or between 770° C. to 830° C., or preferably equal to or between 780° C. to 820° C. After the dopant vapor flow step, the system is returned to a gas composition containing an inert gas, such as nitrogen with an optional flow of oxygen. The temperature may then be ramped up to a second temperature set point for the drive-in step. The second temperature may be in the range equal to or between 830° C. to 900° C., or preferably equal to or between 840° C. to 880° C. In some embodiments, the difference in first and second temperature, or temperatures used during the dopant vapor flow and the drive-in steps, is greater than or equal to 30° C. or greater than or equal to 40° C.

The system may remain at the first temperature set point for any amount of time required for an adequate dopant source layer to form. In some embodiments, the amount of time may be in the range of 10 minutes to 1 hour. In some embodiments, the amount of time is preferably in the range of 10 minutes to 40 minutes. It may be desirable to have the system reach the first temperature set point and stabilize at that temperature prior to commencing the dopant vapor flow. In some embodiments, the stabilization period may be from 1 to 20 minutes, or more preferably 2 to 10 minutes.

In some embodiments, the thickness of the dopant source layer formed on the silicon may be in the range of 5 to 50 nm, or more preferably in the range of 10 to 30 nm. In some embodiments, the dopant source layer may contain a very high concentration of dopant, such as up to 20% of the mass of the dopant source layer comprising the dopant molecule. Alternatively, in other embodiments, processing conditions may be used in order to provide a dopant source layer with considerably lower dopant concentration. In some embodiments, dopant concentration in the dopant source layer may less than 10% of the mass of the dopant source layer, or more preferably less than 7% of the mass of the dopant source layer. Furthermore, conditions may be chosen such that the dopant concentration is not uniform throughout the thickness of the dopant source layer. For example, in some embodiments the dopant source layer at the end of the drive in may have a relatively low concentration of dopant near the interface between the silicon and the dopant source layer. In such a case, the dopant source layer near the interface will be composed of nearly pure SiO$_x$, and thus serve as a useful passivation layer.

The system may remain at the second temperature set point for any amount of time required to allow penetration of the dopant to a sufficient depth within the substrate. The depth of penetration of the dopant can be quantified as a depth at which the concentration of the dopant equals the background concentration of the bulk dopant already present in the silicon wafer. In some embodiments, desirable penetrations depths are 0.1 to 2 microns, or more preferably 0.2 to 1.0 micron. In some embodiments, the system may remain at the second temperature set point for 10 minutes to 2 hrs, or more preferably 15 minutes to 1.5 hrs. It may be desirable to have the time at the second temperature set point exceed the time at the first temperature set point. Furthermore, it may be desirable that when the amount of time or temperature of the first temperature set point are on the lower end of the above stated ranges, then the time spent at the second temperature set point will be on the higher end of the above mentioned ranges. Not wishing to be bound by theory, this may be due to the fact that if less dopant is deposited during the dopant vapor flow, a more aggressive drive in may be required to effectively use that smaller amount of dopant.

It has been found that certain diffusion conditions work best with the LPD produced barrier. In some embodiments, it is desirable to tune the thickness of the LPD layer to get the highest difference in substrate doping between areas that have the barrier and those that do not. While a thicker LPD layer can be utilized, it is preferable only utilize a thickness necessary to achieve to achieve the desired doping levels. Further, this allows the process to remain fast and relatively inexpensive. The parameters that can be measured is the total amount of dopant (in areas containing the barrier layer versus those areas that do not), or more easily the sheet resistance of the respective areas.

It has been found that the inclusion of a step exposing the wafer to a concentration of 1% (molar) oxygen or greater for 2 minutes or greater improves the performance of the LPD film as a barrier layer. This exposure step is performed after the initial temperature ramp, but prior to the dopant vapor flow. In some embodiments, the flow of inert gas used during the initial temperature ramp (e.g. $N_2$) may be maintained during this step of exposing the wafer to oxygen. In some embodiments, the temperature during the step of exposing the wafer to oxygen corresponds to the ending temperature of the initial temperature ramp stage. In some embodiments, the temperature during the step of exposing the wafer to oxygen may remain constant. However, other embodiments may include multiple temperature stages. Not wishing to be bound by theory, it is believed that the inclusion of such step either reduces any porosity that exists in the as deposited LPD film, or provides appropriate chemical termination to and chemical moieties in the LPD films that were not previously reacted and converts them to stoichiometric $SiO_2$.

In some embodiments, the molar concentration of the dopant in the dopant vapor flow can be equal to or between 0.1 to 3%, preferably equal to or between 0.25 to 1%. In some embodiments, the molar concentration of the dopant may be varied during the course of the dopant vapor flow. For example, it may be useful to have a low concentration of dopant initially followed by an increased dopant concentration. In some embodiments, the molar concentration may transition between one or more fixed dopant concentration set points during the course of the dopant vapor flow step. Alternatively, the dopant concentration may be continuously varied during the dopant vapor flow step, such as by a concentration ramp wherein the dopant concentration steadily increases during the course of the dopant vapor flow step.

Additionally, certain oxygen concentrations are desirable during the dopant vapor flow to ensure the best operation of the LPD barrier layer. In some embodiments, the molar oxygen concentration in the dopant vapor flow step can be equal to or between 0.5 to 3%, preferably equal to or between 0.7 to 2%.

After the doping process, layers present from prior process steps may be optionally removed (step 160). These layers may include the dopant glasses that are a byproduct of the diffusion process, including phosphosilicate glasses or borosilicate glasses. These layers may also include the LPD barrier layers that have been previously applied. The removal may be accomplished with any chemical bath that dissolves the desired layers. For example, a bath containing HF may be utilized to dissolve the layers.

Next, the substrate may optionally undergo additional processing steps to independently pattern additional doping regions (step 170). Alternatively, the substrate may go on to subsequent steps involved in standard solar cell construction such as, but not limited to, the application of the antireflection layer, application of metal contacts, assembly into photovoltaic modules, or the like. For selective emitter applications, the application of the contacts may be aligned with the LPD pattern created by the combination of steps 120 and 130. This alignment can be achieved with mechanical means referencing from edges and/or corners of the wafer, optical means referencing from edges and/or corners of the wafer, or fiducial marks that are applied on or before step 120, or a combination thereof.

Figure 2B:
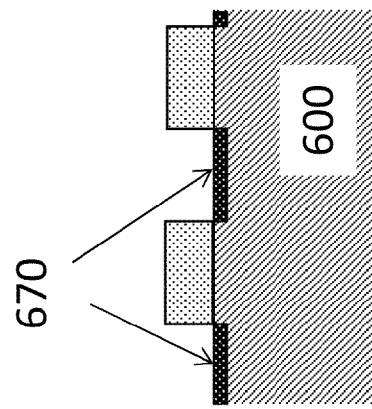
FIGS. 2A-2D are illustrative embodiments of a substrate with patterned nanoscale texture and emitter doping.
Figure 2D:
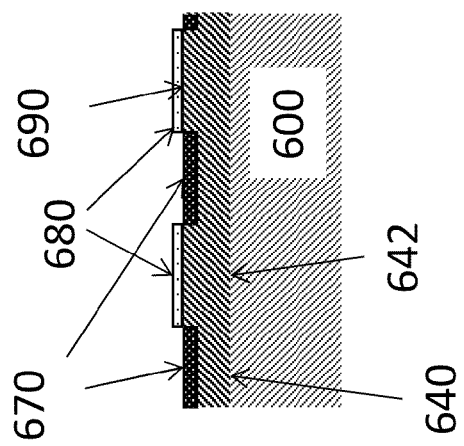
Figure 2A:
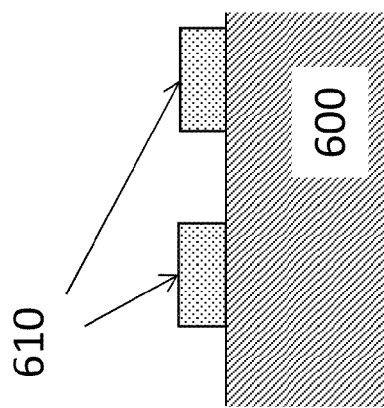
Figure 2C:
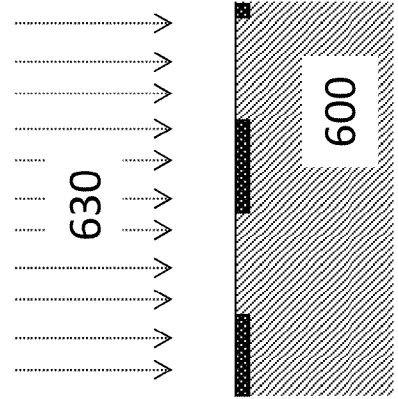

FIGS. 2A-2D are illustrative embodiments of a substrate with patterned nanoscale texture produced using a post-nano emitter method. A polymer resist pattern 610 is printed on to substrate 600 (FIG. 2A). The resulting substrate is immersed in a solution or series of solution capable of forming a nanoscale texture on the surface, resulting in a patterned nanoscale textured regions 670 in the areas absent of the polymer resist 610 (FIG. 2B). The polymer resist 610 is removed by appropriate treatment with a solvent or dry process and the substrate is subjected to a doping process 630 (FIG. 2C) which leads to doping region 640 which exists on both the nanoscale textured surface 670 and on the areas 690 without nanoscale texture. In subsequent steps, areas 690 without nanoscale texture may be aligned with the front metal grid contacts 680. Despite the fact that all areas have received a uniform doping treatment, it is likely that the areas with nanoscale texture 640 will exhibit a higher resistivity than areas without nanoscale texturing 642 due to their porous nature.

Figure 3A:
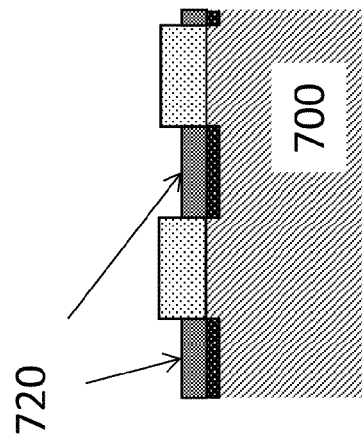
FIGS. 3A-3E are illustrative embodiments of a substrate with patterned nanoscale texture and emitter doping.
Figure 3B:
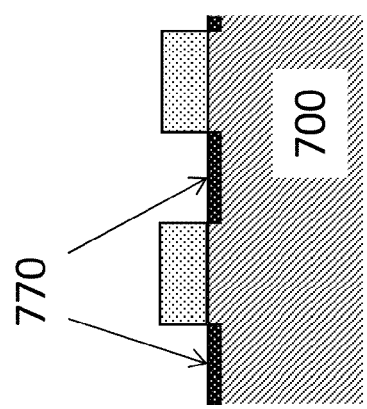
Figure 3C:
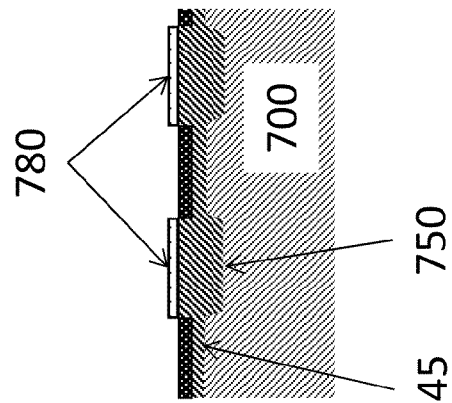
Figure 3D:
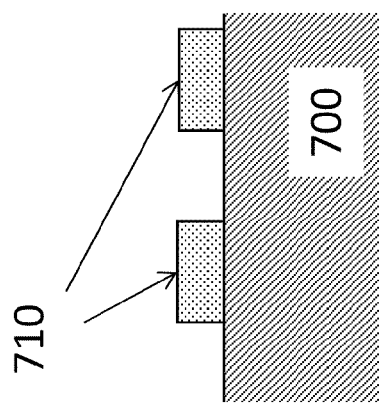
Figure 3E:
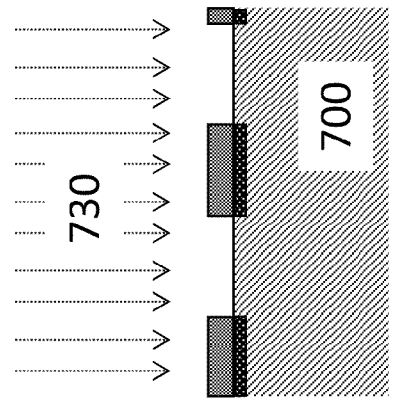

FIGS. 3A-3E are illustrative embodiments of a substrate with patterned nanoscale texture produced using a post-nano emitter method. An LPD film is applied over and in registration with the nanoscale texture to act as a diffusion barrier during subsequent doping, yielding a structure that is a nanoscale textured selective emitter cell with minimal processing. A polymer resist pattern 710 is printed on to substrate 700 (FIG. 3A). The resulting substrate is immersed in a solution or series of solution capable of forming a nanoscale texture on the surface, resulting in a patterned nanoscale textured regions 770 in the areas absent of the polymer resist 710 (FIG. 3B). The resulting substrate is immersed in an LPD deposition solution, resulting in a patterned LPD barrier layer 720 in the areas absent of the polymer resist 710 (FIG. 3B). The resulting LPD barrier layer 720 is automatically aligned, also termed self-aligned, to the underlying nanoscale textured regions 770, or in other words, the barrier layer only covers the nanoscale textured regions. Thus, when resist 710 is removed, nanoscale textured regions 770 are covered by barrier layer 720 and un-etched regions are uncovered by the barrier layer. The LPD barrier layer 720 may be thin enough that during the doping process 730 diffusion of the dopant through the barrier will be impeded, but will still occur, thereby leading to some doping under the barrier. In some embodiments, an LPD barrier layer 720 that allows some doping to occur may be equal to or less than 100 nm thick. In other embodiments, an LPD barrier layer 720 that allows some doping to occur may be equal to or less than 50 nm thick, preferably equal to or less than 30 nm. The polymer resist 710 is removed by appropriate treatment with a solvent or dry process. The substrate is then subjected to a doping process 730 (FIG. 3D) which leads to surface doping layer regions 745 and 750 (FIG. 3E). Region 745 which sits under the LPD barrier layer is less deep than region 750 which is associated with no barrier layer. As a result, region 745 would have a higher resistivity than region 750, as is required for a selective emitter construction. For completion of a solar cell according to this embodiment, metal contacts 780 may be substantially aligned to the regions 750 containing the deeper doping and without nanoscale texturization. This can occur at any suitable point in the remaining process.

Figure 4A:
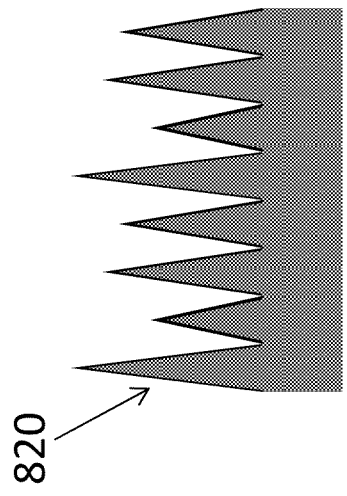
FIGS. 4A-4C are an illustrative example of the formation of a dead layer in during diffusion of a porous structure.
Figure 4B:
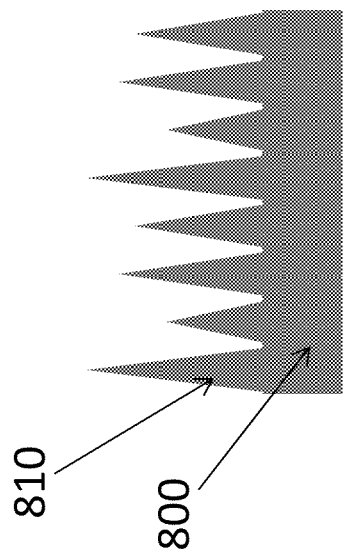
Figure 4C:
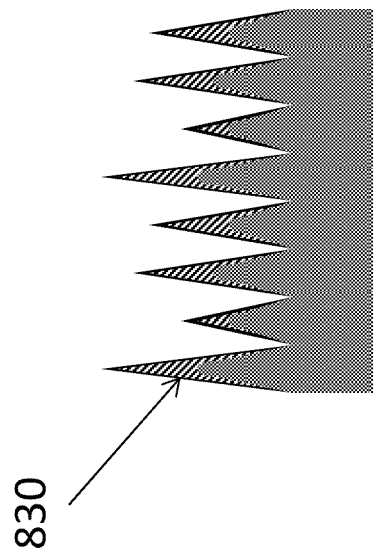

FIGS. 4A-4C are an illustrative example of the formation of a dead layer in during diffusion of a porous structure. A substrate 800 includes porous structures 810 on a surface such as shown in FIG. 4A. The porous structures are drawn as spike features, but it will be recognized by one of ordinary skill in the art that the porous structure could be any suitable silicon black structure, such as cones, pores, nanowires, or the like. During the dopant vapor flow step a dopant source layer 820 is deposited on the porous structures 810 as shown in FIG. 4B, with very little penetration of dopant into the structure. After a drive in step as shown in FIG. 4C, the appearance of very highly doped dead regions 830 may occur, such as near the top of the porous structures 810. The diffusion systems and method discussed herein are directed towards minimizing or eliminating the degree of formation of the dead regions 830.

EXPERIMENTAL EXAMPLE

The following examples are included to demonstrate particular aspects of the present disclosure. It should be appreciated by those of ordinary skill in the art that the methods described in the examples that follow merely represent illustrative embodiments of the disclosure. Those of ordinary skill in the art should, in light of the present disclosure, appreciate that many changes can be made in the specific embodiments described and still obtain a like or similar result without departing from the spirit and scope of the present disclosure.

Example 1—Single Temperature Diffusion Control

A solar grade p-type wafers measuring 125 mm×125 mm is etched in a 20% sodium hydroxide solution that is maintained at 75° C. to remove undesirable surface texture. The wafer is etched for 5 minutes then rinsed with high purity water and additionally cleaned with a solution of 1:1:6 $HCl:H_2O_2$:water maintained at 80° C. for 10 minutes to remove any additional contamination. A single side of the wafer is expose to a solution containing 10 mM of $AgNO_3$ and 4.8M HF for 10 seconds at room temperature to cause the formation of a coating of silver nanoparticles. After rinsing with high purity water, the wafer is etched on a single side in a solution of 4.8M HF and 0.5M $H_2O_2$ for 40 seconds in order to produce a nanoparticle catalyzed etch of the surface. The resulting surface is of low reflectivity with a reflectivity of below 3%, and thus characterized as black silicon. The wafer is then dipped in a 6M solution of $HNO_3$ for 5 minutes in order to remove the silver nanoparticles. It will be recognized by one of ordinary skill in the art that this above noted example is a nonlimiting example of producing black silicon. Any other suitable methods for producing black silicon may be utilized in other embodiments.

An emitter diffusion is then performed in a horizontal tube diffusion furnace equipped with 8 inch diameter quartz tubes. The wafers is loaded at a rate of 6 inches per minute into the tube maintained at 700° C. under $N_2$ flow. Once the wafer is fully loaded into the tube, the temperature is then ramped to 875° C. under $N_2$ flow over 20 minutes. The samples are then held for 5 minutes at 875° C. in a flow of 4 lpm $N_2$ and 200 sccm $O_2$. These steps may be considered to be part of the initial temperature ramp in the doping steps previously.

During the dopant vapor flow step, a flow of 690 sccm $N_2$ is bubbled through a volume of $POCl_3$ maintained at 18° C. and introduced in the tube for 10 minutes. At the end of the 10 minute phosphorous doping vapor flow step, the $POCl_3$ bubbler flow is turned off and a flow of 7 slm $N_2$ and 800 sccm $O_2$ is maintained in the tube for 20 minutes as the drive in step. The tube is then returned to pure $N_2$ flow and allowed to cool for 10 minutes during a cool down step prior to unloading the samples.

The resulting wafers are screen printed with a front silver grid pattern using DuPont PV 17A and a full rear back surface field using DuPont PV381 aluminum paste. The sample is then rapid fired in an $N_2/O_2$ environment to a maximum temperature of 810° C. according to industry standards.

The resulting cell is characterized by its short circuit current ($J_{sc}$) under illumination of 1 sun (or standard illumination at AM1.5 global, 1000 W/m$^2$) as an indicator of total utilization of light to generate photocurrent. The cell of example 1 showed a $J_{sc}$ of 22.8 mA/cm$^2$.

Example 2 (BR215-12)

Example 2 was identical in fabrication steps to example 1 with the exception of the emitter diffusion. Notably, Example 2 utilizes different temperature set points during the dopant vapor flow and drive in. The wafers are loaded at a rate of 6 inches per minute into the tube maintained at 700° C. under $N_2$ flow. Once the wafer is loaded, the temperature is then ramped to 800° C. under $N_2$ flow over 20 minutes. The samples are then held for 5 minutes at 800° C. in a flow of 4 lpm $N_2$ and 200 sccm $O_2$. At that point, a flow of 690 sccm $N_2$ is bubbled through a volume of $POCl_3$ maintained at 18° C. and introduced in the tube for 20 minutes. At the end of the 20 minute phosphorous doping, the $POCl_3$ bubbler flow is turned off and a flow of 7 slm $N_2$ and 800 sccm $O_2$ is maintained in the tube while the temperature is ramped to a secondary temperature set point of 875° C. The tube is maintained at 875° C. for 20 minutes as the elevated temperature drive in. The tube is then returned to pure $N_2$ flow and allowed to cool for 10 minutes prior to unloading the samples. The cell of example 1 showed a $J_{sc}$ of 24.5 mA/cm$^2$, thus showing improvement by providing a lower temperature set point during the dopant vapor flow step and a higher temperature set point during the drive in step.

Example 3 (BR229-7)

Example 3 represents a control group. Example 3 was based upon example 1 with the following differences. Firstly, the first step of the black silicon treatment involved exposing a single side of the wafer to a solution containing 10 mM of $AgNO_3$ and 4.8M HF for 15 seconds at room temperature to cause the formation of a coating of silver nanoparticles. Secondly, the diffusion temperature was 845° C. The cell of example 3 showed a $J_{sc}$ of 23.7 mA/cm$^2$.

Example 4 (BR229-4)

Example 4 was identical in fabrication steps to example 3 with the exception of the emitter diffusion Like Example 2, Example 4 utilizes different temperature set points during the dopant vapor flow and drive in. The wafers are loaded at a rate of 6 inches per minute into the tube maintained at 700° C. under $N_2$ flow. Once the wafer is loaded, the temperature is then ramped to 785° C. under $N_2$ flow over 20 minutes. The samples are then held for 5 minutes at 785° C. in a flow of 4 lpm $N_2$ and 200 sccm $O_2$. At that point, a flow of 690 sccm $N_2$ is bubbled through a volume of $POCl_3$ maintained at 18° C. and introduced in the tube for 20 minutes. At the end of the 20 minute phosphorous doping, the $POCl_3$ bubbler flow is turned off and a flow of 7 slm $N_2$ and 800 sccm $O_2$ is maintained in the tube while the temperature is ramped to a secondary temperature set point of 845° C. The tube is maintained at 845° C. for 20 minutes as the elevated temperature drive in. The tube is then returned to pure $N_2$ flow and allowed to cool for 10 minutes prior to unloading the samples. The cell of example 4 showed a $J_{sc}$ of 26.5 mA/cm$^2$, thus showing improvement by providing a lower temperature set point during the dopant vapor flow step and a higher temperature set point during the drive in step.

Implementations described herein are included to demonstrate particular aspects of the present disclosure. It should be appreciated by those of skill in the art that the implementations described herein merely represent exemplary implementation of the disclosure. Those of ordinary skill in the art should, in light of the present disclosure, appreciate that many changes can be made in the specific implementations described and still obtain a like or similar result without departing from the spirit and scope of the present disclosure. From the foregoing description, one of ordinary skill in the art can easily ascertain the essential characteristics of this disclosure, and without departing from the spirit and scope thereof, can make various changes and modifications to adapt the disclosure to various usages and conditions. The implementations described hereinabove are meant to be illustrative only and should not be taken as limiting of the scope of the disclosure.

What is claimed is:

1. A method for forming a solar cell, the method comprising:
   depositing a resist layer on a top surface of a substrate, wherein the resist layer serves as a barrier to etching;
   etching the top surface of the substrate, wherein exposed regions of the substrate are black etched and covered regions with the etching barrier layer remain un-etched;
   removing the resist layer to expose the covered regions; and
   doping the substrate to form an emitter, wherein after doping, the exposed regions have a higher resistivity than un-etched regions.

2. The method of claim 1, wherein the doping comprises the steps of:
   performing an initial ramp, wherein a substrate temperature is raised to diffusion temperatures during the initial ramp;
   exposing the substrate to dopant vapor flow during a doping stage;
   stopping the vapor flow during a drive-in step, exposing the substrate to an inert gas, and raising the temperature of the substrate to drive-in temperatures; and
   cooling the substrate for a predetermined period of time.

3. The method of claim 2, wherein the initial ramp includes two or more stages of set temperature increases.

4. The method of claim 2, wherein the substrate is exposed to $N_2$ and/or $O_2$ during the initial ramp.

5. The method of claim 2, wherein the substrate is exposed to oxygen after the initial ramp and before the dopant vapor flow.

6. The method of claim 5, wherein the substrate is exposed to the oxygen for 2 minutes or greater before the dopant vapor flow.

7. The method of claim 2, wherein doping temperatures during the doping stage are equal to or between 770 to 830° C.

8. The method of claim 2, wherein the drive-in temperatures are equal to or between 830 to 900° C.

9. The method of claim 2, wherein the drive-in temperatures are 30° C. or greater than doping temperatures during the doping stage.

10. The method of claim 2, wherein the doping stage comprises exposing the substrate to a gas providing phosphorous or a phosphorous containing precursor.

11. The method of claim 2, wherein the substrate is coated with a dopant layer prior to the dopant vapor flow.

12. The method of claim 1 further comprises depositing a dopant barrier layer after the etching step and before removing the resist layer, wherein the dopant barrier layer is self-aligned to the etched regions, and the dopant barrier layer reduces doping in the etched regions.

13. The method of claim 12, wherein the dopant barrier layer is deposited by liquid phase deposition (LPD).

14. The method of claim 12, wherein the dopant barrier layer equal to or less than 50 nm thick.

15. The method of claim 1, wherein the resist layer is a polymer that is not water soluble, and does not degrade, crosslink or harden during the etching step.

16. The method of claim 15, wherein the polymer is comprised of poly(vinylbutyral), poly(vinylacetate), and/or poly(vinylalcohol).

* * * * *